(12) United States Patent
Lin et al.

(10) Patent No.: US 6,747,350 B1
(45) Date of Patent: Jun. 8, 2004

(54) FLIP CHIP PACKAGE STRUCTURE

(75) Inventors: Wei-Feng Lin, Hsinchu (TW);
Yin-Chieh Hsueh, Kaohsiung (TW);
Chung-Ju Wu, Kaohsiung (TW)

(73) Assignee: Silicon Integrated Systems Corp., Hsin-chu (TW)

( * ) Notice: Subject to any disclaimer, the term of this patent is extended or adjusted under 35 U.S.C. 154(b) by 0 days.

(21) Appl. No.: 10/455,525

(22) Filed: Jun. 6, 2003

(51) Int. Cl.⁷ .................................................. H01L 23/12
(52) U.S. Cl. ........................................ 257/704; 257/707
(58) Field of Search ................................. 257/704, 706, 257/707, 783, 778, 787

(56) References Cited

U.S. PATENT DOCUMENTS

| | | | |
|---|---|---|---|
| 5,311,059 A | 5/1994 | Benerji et al. | |
| 5,371,404 A | 12/1994 | Juskey et al. | |
| 5,977,626 A | 11/1999 | Wang et al. | |
| 6,255,140 B1 | 7/2001 | Wang | |
| 6,432,742 B1 * | 8/2002 | Guan et al. | 438/106 |
| 6,437,437 B1 * | 8/2002 | Zuo et al. | 257/710 |
| 6,469,381 B1 * | 10/2002 | Houle et al. | 257/707 |
| 6,519,154 B1 * | 2/2003 | Chiu | 361/704 |
| 6,525,420 B2 * | 2/2003 | Zuo et al. | 257/715 |
| 6,538,319 B2 * | 3/2003 | Terui | 257/704 |
| 6,566,748 B1 * | 5/2003 | Shimizu et al. | 257/704 |

FOREIGN PATENT DOCUMENTS

| | | |
|---|---|---|
| JP | 2000-77575 A | 3/2000 |
| TW | 410445 | 11/2000 |
| TW | 508778 | 11/2002 |

* cited by examiner

Primary Examiner—S. V. Clark
(74) Attorney, Agent, or Firm—Birch, Stewart, Kolasch & Birch, LLP

(57) ABSTRACT

A flip chip package structure. The structure includes a substrate, an IC chip electrically connected to the substrate through a plurality of conductive bumps, encapsulant between the substrate and IC chip, and an electrically protective device. The substrate has interior wiring, a plurality of first contacts arranged at a predetermined pitch among each other on a surface, and a trace line area beyond the first contacts on the surface. The electrically protective device has a protruding part covering the IC chip, and an extending part extending over the surface of the substrate with a gap as large as 40 mil. The extending part further covers the trace line area, and connects to the surface of the substrate using a fixing material.

10 Claims, 10 Drawing Sheets

FLIP CHIP PACKAGE STRUCTURE

BACKGROUND OF THE INVENTION

1. Field of the Invention

The present invention relates to a semiconductor device, and more specifically to a flip chip package structure.

2. Description of the Related Art

Referring to FIG. 7A, a traditional flip chip package structure 700 is shown. The so-called flip chip technology is typically processed as follows. First, a plurality of conductive bumps 790 are formed on an active surface of IC chip 180, or respectively on a plurality of contacts 710 on a surface of substrate 702. Then, the active surface of IC chip 180 is turned downward in order to attach IC chip 180 to substrate 702. Finally, an encapsulant 770 is formed between IC chip 180 and substrate, and further fills among the conductive bumps 790.

Compared with the traditional wire bonding package structure, the layout of the bonding wires requires larger area. According to a typical flip chip package structure, the joints between IC chip and substrate are only distributed in the range of the surface area of the IC chip. The area of the flip chip package structure or substrate, supporting an I/O count less than 200, can be reduced to as little as 1.2 times that of the IC chip or less, the so-called chip scale package (CSP). However, I/O counts for some IC chips, such as CPU, graphics processing unit (GPU), chipset, or other types of system-on-chip (SOC) designs, are usually more than 300, or even more than 1000, resulting from their multiple functions and high working frequency, all of which require substrates used therein to bear complicated wiring. Therefore, it is difficult for the package structure with such high I/O counts and substrates used therein to be designed as CSP. Compared with the traditional wire bonding package structure, the flip chip package structure provides higher packaging density (greater I/O counts) and performance (shorter possible leads, lower inductance, and better noise control), smaller device footprints, and a lower packaging profile, the flip chip package structures, no matter CSP or non-CSP, are becoming more and more popular.

Due to the demand for small-aspect, light and powerful electronic products, it is necessary for a design rule of a substrate for a flip chip package structure to lay out denser wiring in a limited area of the substrate. It is difficult to add VSS or VDD to the transmission line in the wiring of the substrate to shield the transmission line, resulting in mutual inductance and mutual capacitor, which creates crosstalk in the neighboring trace lines when a signal transition arrives at a trace line, thereby negatively affecting signal quality, system stability, and specifically the character impedance of the transmission line.

One of the important factors affecting the design of a transmission line for a substrate for IC package or other kind of circuit board is impedance matching. A basic structure of the transmission line usually has a first trace line connecting a signal from an output end to a load end, and a second trace line connecting the load end to the output end, thus constructing a circuit. It output impedance of the signal is ZG, load impedance of the signal is ZL, and character impedance of the transmission line is Z0 in the transmission line, the impedance match is denoted as ZG=Z0=ZL. According to the load end, the energy and signals in the transmission line will be completely transmitted to the load end when Z0=ZL. A part of the energy and signals will reflect back to the output end when impedance mismatch occurs from the variation in character impedance of the transmission line caused by the effects of crosstalk, resulting in overshoot, undershoot, ringback, and further negative affecting the integrity of the signal. Not only are signal quality and system stability negatively affected, but the electronic device may also be damaged. When the character impedance of the transmission line is controllable and adjustable, the design of a transmission line for a substrate for IC package or other kind of circuit board is therefore easier.

Furthermore, referring to the flip chip package structure 700 shown in FIG. 7A, IC chip 180 will be mechanically damaged in a subsequent process because IC chip 180 is a bare die.

A technology providing electromagnetic protection of a flip chip package structure from external radio frequency interference (RFI) and electromagnetic interference (EMI) is disclosed in U.S. Pat. No. 5,331,059, disclosing a flip chip package structure having an electrically conductive material covering an exposed semiconductor device and underfill material. The electrically conductive material electrically connects to a grounding pad on a substrate, providing electromagnetic protection for the flip chip package structure, specifically for the exposed semiconductor device. U.S. Pat. No. 5,371,404 discloses a flip chip package structure with a molding compound covering an IC chip and underfill of the flip chip package structure. The molding compound, typically filled approximately 70% to 75% with metallic composition to provide electrical and thermal conductivity, is formed overlying an underfill-formed substrate with a ground pad. The ground pad further connects to an exterior grounding device, thus grounding the flip chip package structure, specifically the IC chip, so as to provide electromagnetic protection for protecting the flip chip package structure from RFI and EMI. The molding compound further comprises a plurality of fins on a top surface further providing heat dissipation for the flip chip package structure.

FIGS. 1A through 1C illustrate a heat spreader (sink) 32 disclosed in U.S. Pat. No. 5,977,626 and Japanese Patent Publication No. P2000-77575A. FIG. 1A illustrates a top view of heat spreader 32, FIG. 1B illustrates a cross-section of heat spreader 32, and FIG. 1C is a cross-section illustrating an application of heat spreader 32 in a flip chip package structure. In FIG. 1A, the heat spreader 32 has a plane 32a, a protruding portion 32b, a supporting member 32c on the central portion of the protruding portion 32b, and four supporting members 32d on the bottom of the plane 32a and at the corners of the plane 32a. In FIG. 1B, a cross-section of the heat spreader 32 along the line AA in FIG. 1A is shown. In FIG. 1C, a die 22 with a plurality of, solder bumps 26a is attached to a surface of substrate 20 using flip chip technology; an underfill 24a is filled under the die 22 and among the solder bumps 26a; the heat spreader 32 is attached to the substrate 20 by connecting the supporting member 32c to the die 22 and connecting the supporting members 32d to the surface of the substrate 20 using attaching material 34 to create electrical connection between the substrate 20 and heat spreader 32; a molding compound 30 is formed covering the heat, spreader 32 but exposing the protruding portion 32b. The heat dissipation of the heat spreader 32 for die 22 is provided by the exposure of the protruding portion 32b and the connection between the die 22 and supporting portion 32c. The electromagnetic protection by the heat spreader 32 for die 22 is provided by the electrical connection between supporting portions 32d and substrate 20, and the connection between the die 22 and supporting portion 32c.

Referring to FIG. 2, a CSP structure disclosed by Taiwan, R.O.C Patent Publication No. 410445 and U.S. Pat. No.

6,255,140 is shown. The CSP structure has a heat slug 312 covering a die 311 attached to a substrate 313 using flip chip technology. The edges of the heat slug 312 connect to the extensive portion of an underfill layer 317 between the die 311 and substrate 313 using an adhesive epoxy 314 which provides thermal conductivity. The heat slug 314 may further electrically connect to substrate 313 to enhance its electromagnetic protection for die 311.

The aforementioned arts provide electromagnetic protection for an IC chip in a flip chip package structure to protect the IC chip from RFI or EMI, but not for a transmission line in the substrate used therein to control the character impedance of the transmission line and. crosstalk among the trace lines in the substrate used therein. As mentioned, the variation in character impedance of the transmission line and crosstalk among the trace lines result from denser wiring in the substrate.

Referring to FIGS. 3A and 3B, a cross-section of a package structure disclosed by Taiwan, R.O.C. Patent Publication No. 508778 in FIG. 3A and a top view of heat sink of the package structure in FIG. 3B are shown. In FIG. 3A, the package structure 2 has a substrate 41, semiconductor chip 42 electrically connected to the substrate 41, and a heat sink 45 overlying the semiconductor chip 42. The heat sink 45 has a first heat-sink portion 45a and a pair of second heat-sink portions 45b respective extended from the two sides of the first heat-sink portion 45a. Disclosed is technology according to the heat sink 45 of the package structure 2 but not for a transmission line in the substrate used therein to control the character impedance of the transmission line and crosstalk among the trace lines in the substrate used therein. As mentioned, the variation in character impedance of the transmission line and crosstalk among the trace lines result from denser wiring in the substrate.

SUMMARY OF THE INVENTION

Thus, the main object of the present invention is to provide a flip chip package structure having an electrically protective device, providing control of the variation in character impedance of a transmission line in the flip chip package structure, thereby improving the signal quality and system stability of the flip chip package structure.

Another object of the present invention is to provide a flip chip package structure having an electrically protective device, providing control of the variation in the character impedance of a transmission line in the flip chip package structure, not only improving the signal quality and system stability of the flip chip package structure, but also protecting the IC chip of the flip chip package structure from damage from abnormal signals, increasing the reliability and lifetime of the flip chip package structure.

Another object of the present invention is to provide a flip chip package structure having an electrically protective device, providing control of the variation in the character impedance of a transmission line in the flip chip package structure, and further protecting the IC chip of the flip chip package structure from mechanical damage during the subsequent processes.

In order to achieve the above objects, the present invention provides a flip chip package structure. The structure comprises a substrate, IC chip, encapsulant, and electrically protective device. The substrate comprises interior wiring, a plurality of first contacts, and a trace line area. The first contacts are arranged at a predetermined pitch among each other on a surface of the substrate. The trace line area is also on the surface, beyond the first contacts. The IC chip overlies the surface of the substrate and electrically connects to the substrate with a plurality of conductive bumps. The conductive bumps are arranged at the predetermined pitch among each other between the IC chip and first contacts. The encapsulant is between the substrate and IC chip. The encapsulant is further filling the pitches among the conductive bumps. The electrically protective device has a protruding part and extending part. The protruding part covers the IC chip. The extending part extends over the surface of the substrate with a gap between the extending part and the surface of the substrate not exceeding 40 mil or less. The extending part further covers the trace line area. The extending part further connects to the surface of the substrate with a fixing material so as to fasten the electrically protective device to the substrate.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

The following embodiments are intended to illustrate the invention more fully without limiting their scope, since numerous modifications and variations will be apparent to those skilled in this art.

First Embodiment

Figure 1A:
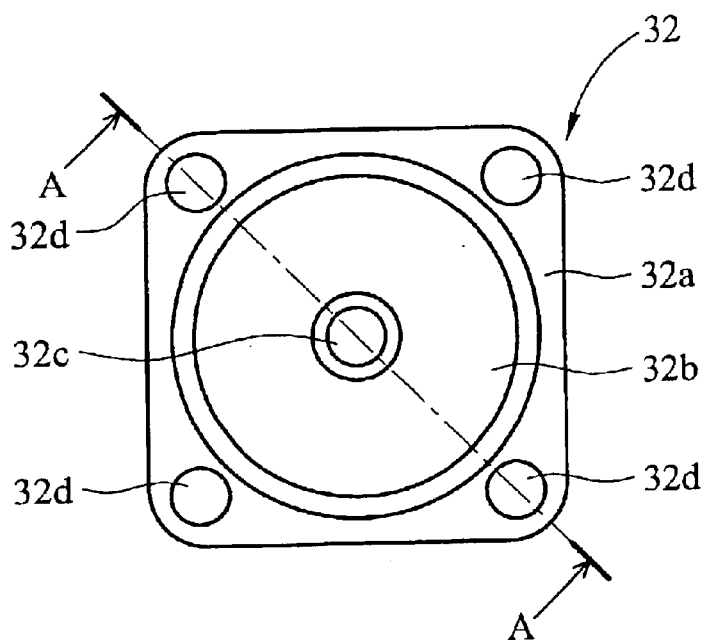
FIGS. 1A through 1C are a top view of cross-sections illustrating a heat spreader disclosed by U.S. Pat. No. 5,977,626 and Japanese Patent Publication No. P2000-77575A and application thereof in a flip chip package structure.
Figure 1B:
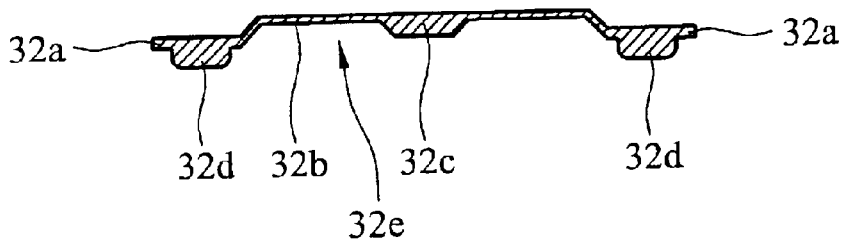
Figure 1C:
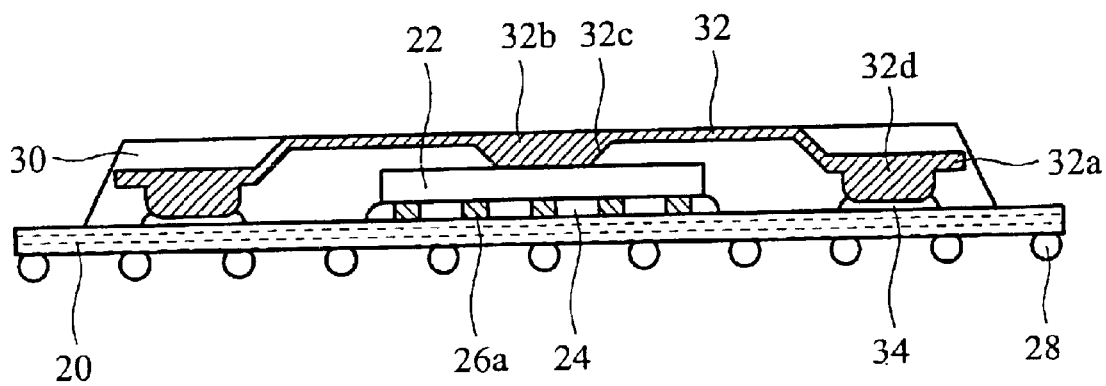
Figure 2:
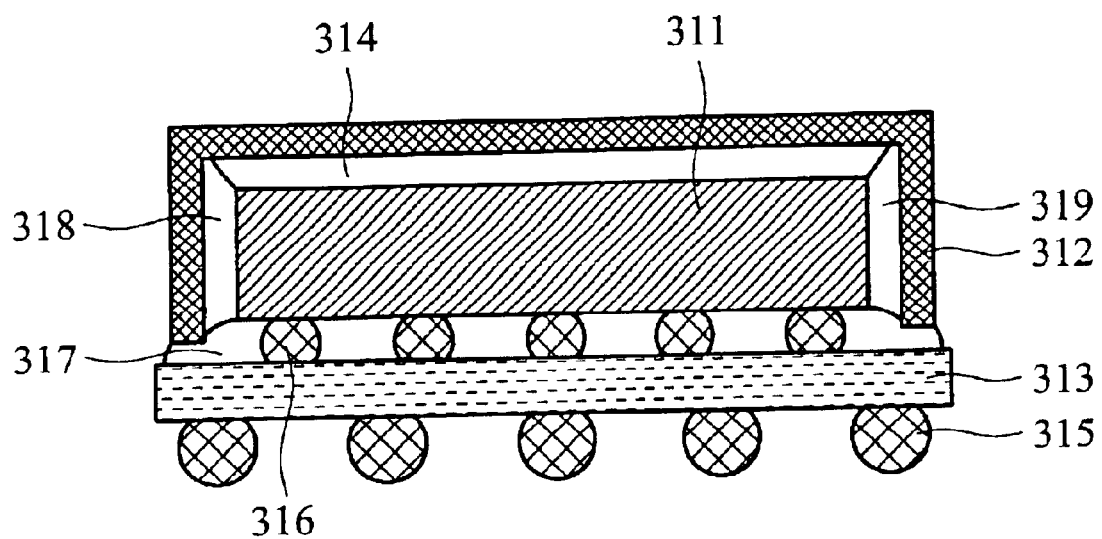
FIG. 2 is a cross-section illustrating a CSP structure disclosed by Taiwan, R.O.C Patent Publication No. 410445 and U.S. Pat. No. 6,255,140.
Figure 3A:
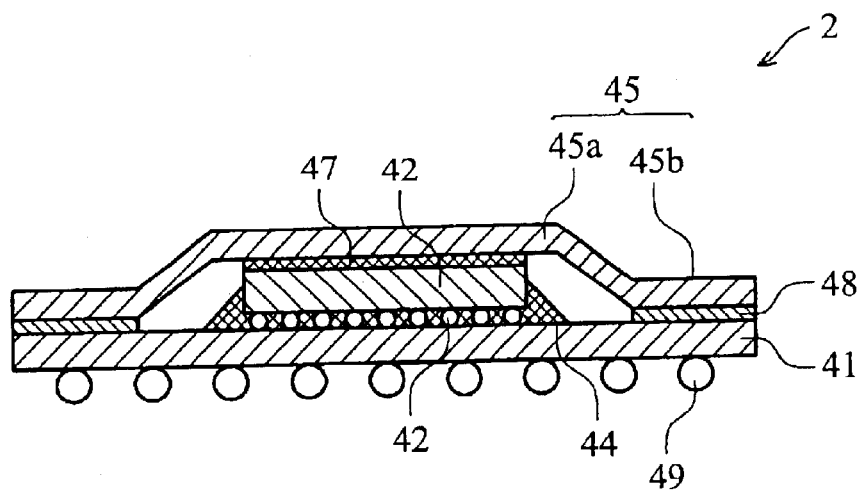
FIGS. 3A and 3B are a cross-section and a top view of a package structure disclosed in Taiwan, R.O.C. Patent Publication No. 508778.
Figure 3B:
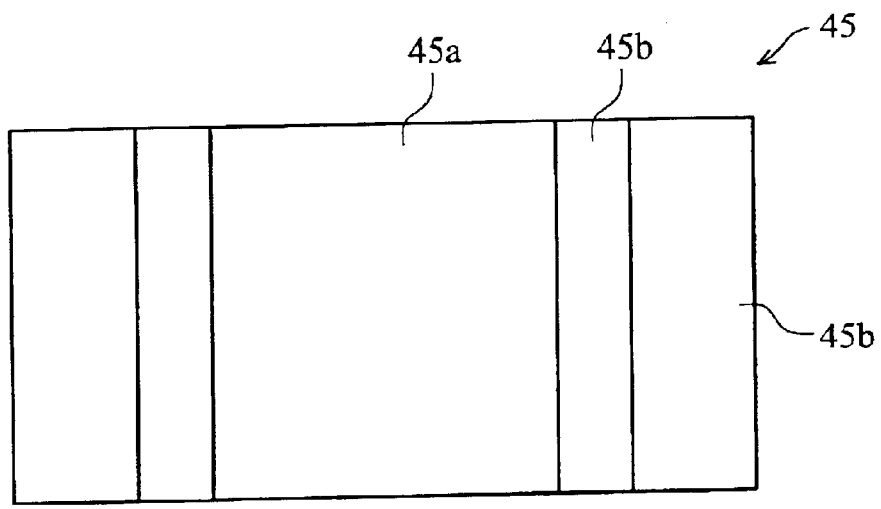
Figure 4A:
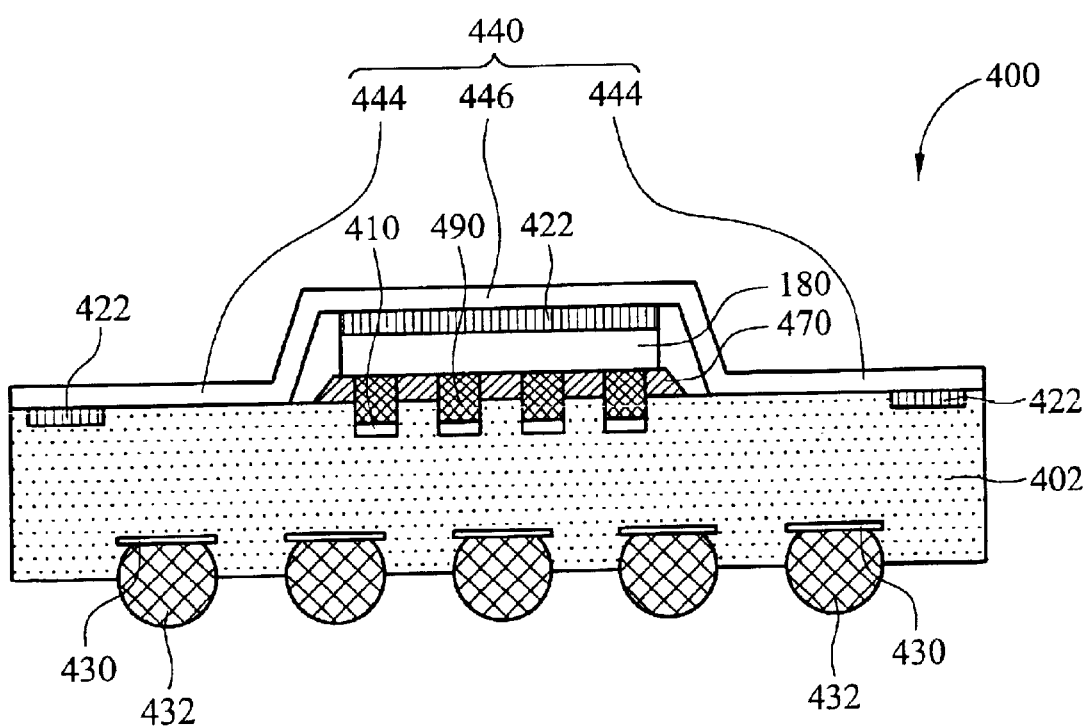
FIGS. 4A through 4C are a cross-section, top view, and sketch map illustrating a flip chip package structure in this embodiment.

Referring to FIG. 4A, a flip chip package structure 400 in this embodiment is shown. A substrate 402 used therein is for BGA and comprises laminated interior wiring with six layers of sub-wirings. Note that the substrate 402 in this embodiment is an example only, and is not intended to limit the present invention. It will be obvious to those skilled in the art to use other types of substrate rather than substrate 402.

Figure 4B:
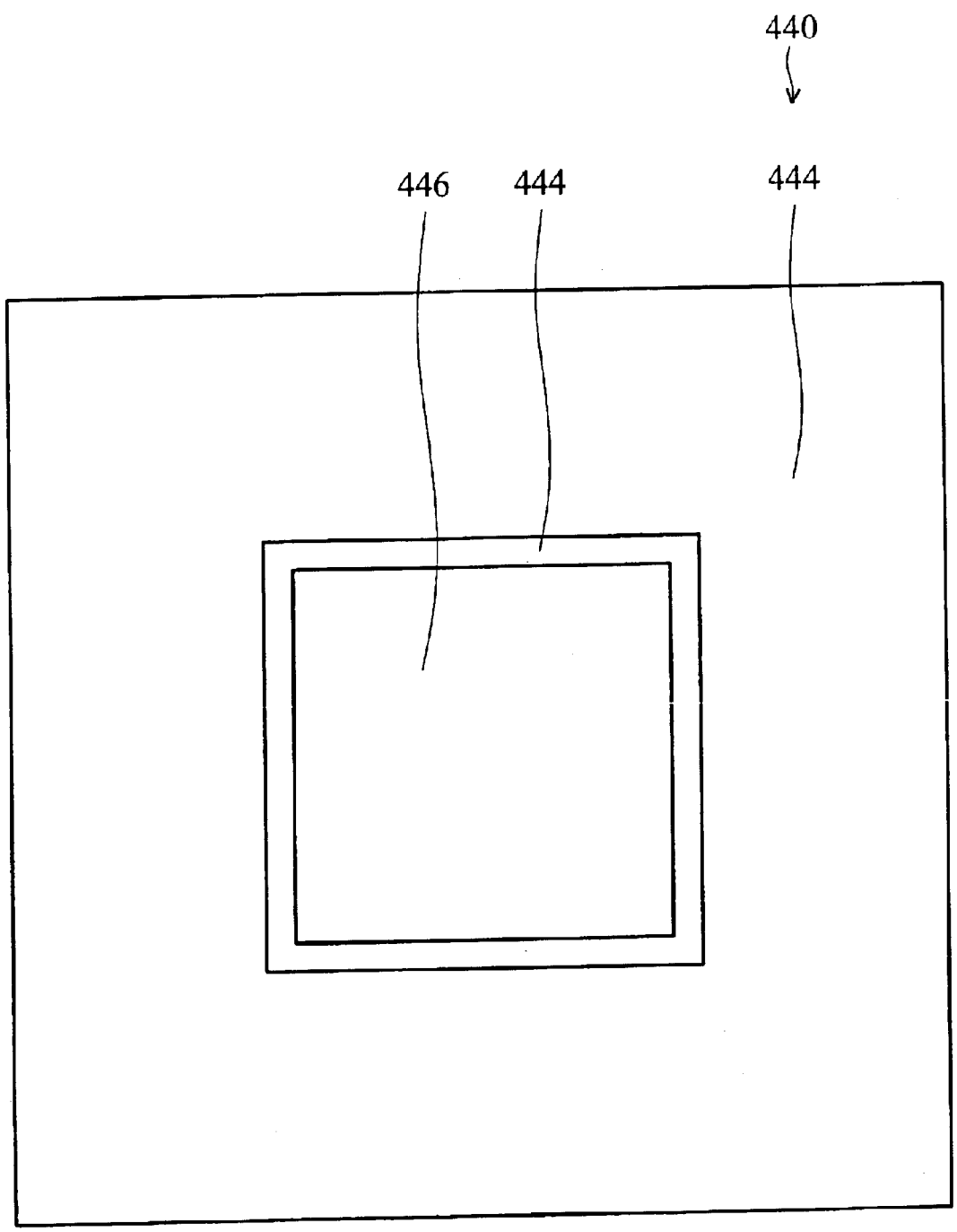

The flip chip package structure 400 in this embodiment has an electrically protective device 440 providing both control and adjustability of the variation in the character impedance of the transmission lines of the flip chip package structure 400. The substrate 402 has a plurality of contacts 410, arranged at a predetermined pitch among each other, on a surface. An IC chip 180 overlies a surface of substrate 402 and electrically connects to the substrate 402 with a plurality of conductive bumps 490 arranged at the predetermined pitch among each other between the IC chip 180 and contacts 410. The encapsulant 470 is between the substrate 402 and IC chip 180, and specifically among the conductive bumps 490. The electrically protective device 440, whose top view is shown in FIG. 4B, has a protruding part 446 and extending part 444. The protruding part 446 covers the IC chip 180. The extending part 444 extends over the surface of substrate 402 to both control and adjust the variation in the character impedance of the transmission lines of the flip chip package structure 400. A fixing material 422 is provided for connecting the extending part 444 and the surface of substrate 402 so as to fasten the electrically protective device 440 to the substrate 402.

Further, the fixing material 422 may further provide connection of the IC chip 180 and protruding part 446 when heat dissipation is required. Thus, the electrically protective device 440 is able to further assist IC chip 180 in heat dissipation.

The electrically protective device 440 is preferably electrically conductive material such as Al or Cu, and may further comprise a coating layer on the surface thereof for anti-corrosion or to enhance the mechanical properties of the electrically protective device 440. The fixing material 442 is preferably thermally conductive material such as a mixture of silver powders and epoxy resins.

Figure 4C:
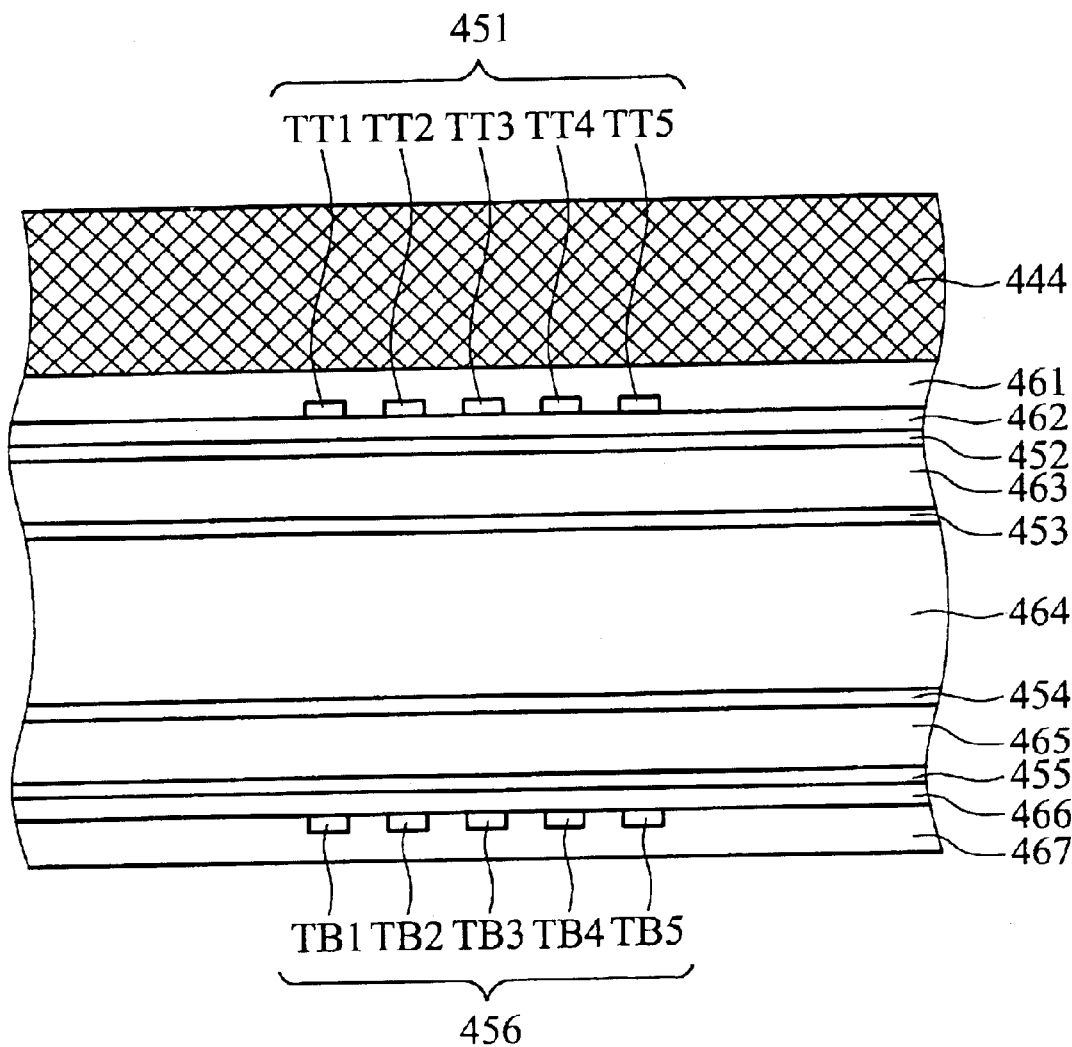

There is a trace line area (shown in FIG. 4C as the top trace lines TT1 through. TT5) beyond the contacts 410 on the surface of the substrate 402, conformally covered by the extending part 444, or with a gap therebetween no more than approximately 40 mil. There is no gap between the trace line area and extending part 444 in this embodiment.

Further, the substrate 402 has a plurality of external contacts 430 respectively joined by a solder ball 432 on the other surface. The solder ball 432 may be Sn-based alloy with or without Pb. The flip chip package structure 400 may be attached to an external device (not shown) by reflowing the solder ball 432 to finish a final electronic product (not shown).

Referring to FIG. 4C, relationships between positions of the laminated wiring of the substrate 402 and the extending part 444 are shown. In FIG. 4C, more detailedly, five top trace lines TT1 through TT5 of a first-layer sub-wiring 451 and five bottom trace lines TB1 through TB5 of a sixth-layer sub-wiring 456 are shown. Line widths of top trace lines TT1 through TT5 and bottom trace lines TB1 through TB5 are all approximately 40 $\mu$m. Line thicknesses of top trace lines TT1 through TT5 and bottom trace lines TB1 through TB5 are all approximately 15 $\mu$m. The spaces between two neighboring top trace lines and between two neighboring bottom trace lines are all approximately 40 $\mu$m. The top trace lines TT1 through TT5 are covered by a solder mask 461 about 40 $\mu$m thick. The bottom trace lines TB1 through TB5 are covered by a solder mask 467 about 40 $\mu$m thick. There are a dielectric layer 462 about 33 $\mu$m thick between the first-layer sub-wiring 451 and second-layer sub-wiring 452, a dielectric layer 463 about 70 $\mu$m thick between the second-layer sub-wiring 452 and third-layer sub-wiring 453, a dielectric layer 464 about 502 $\mu$m thick between the third-layer sub-wiring 453 and fourth-layer sub-wiring 454, a dielectric layer 465 about 70 $\mu$m thick between the fourth-layer sub-wiring 454 and fifth-layer sub-wiring 455, and a dielectric layer 466 -about 33 $\mu$m thick between the fifth-layer sub-wiring 455 and sixth-layer sub-wiring 456. The second-layer sub-wiring 452, third-layer sub-wiring 453, fourth-layer sub-wiring 454, and fifth-layer sub-wiring 455 are all massive copper layers respectively about 21 $\mu$m, 18 $\mu$m, 18 $\mu$m, and 21 $\mu$m thick. The second-layer sub-wiring 452 and third-layer sub-wiring 453 are both VSS layers acting as ground layers. The fourth-layer sub-wiring 454 and fifth-layer sub-wiring 455 are both VDD layers acting as power layers.

There is no gap between the extending part 444 of the electrically protective device 440and the solder mask 461 of the substrate 402 in this embodiment. The electrically protective device 440 in this embodiment is not grounded, such that neither the second-layer sub-wiring 452, third-layer sub-wiring 453, nor other kind of grounding device is electrically connected to the electrically protective device 440. The range of the character impedance of the transmission lines of the flip chip package structure 400 in this embodiment, determined by electrically simulated experiment, is listed in Table 1, as are the mutual inductance values between two selected single trace lines.

Second Embodiment

Figure 5:
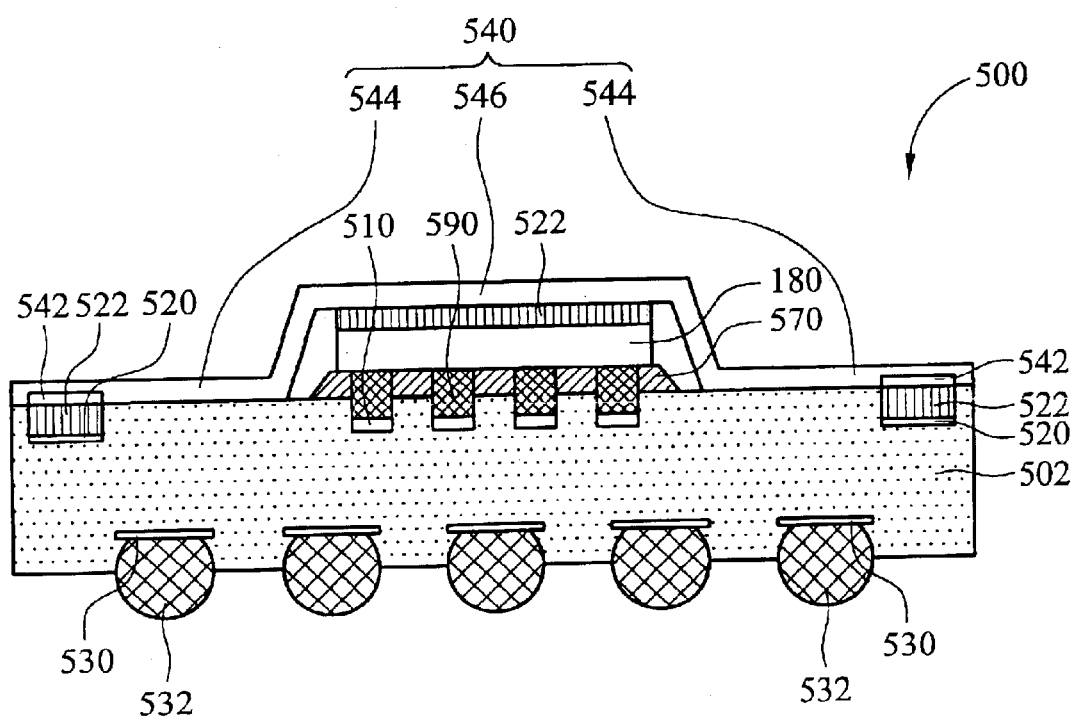
FIG. 5 is a cross-section illustrating a flip chip package structure in this embodiment.

Referring to FIG. 5, a flip chip package structure 500 in this embodiment is shown. A substrate 502 used therein is for BGA and comprises laminated interior wiring with six layers of sub-wirings. Note that the substrate 502 in this embodiment is an example only, and is not intended to limit the present invention. It will be obvious to those skilled in the art to use other types of substrate in addition to substrate 502.

The flip chip package structure 500 in this embodiment has an electrically, protective device 540 providing both control and adjustability of the variation in the character impedance of the transmission lines of the flip chip package structure 500. The substrate 502 has a plurality of contacts 510, arranged at a predetermined pitch among each other, and a plurality of contacts 520 on a surface. An IC chip 180 overlies a surface of substrate 502 and electrically connects to the substrate 502 with a plurality of conductive bumps 590 arranged at the predetermined pitch among each other between the IC chip 180 and contacts 510. The encapsulant 570 is between the substrate 502 and IC chip 180, and specifically among the conductive bumps 590. The electrically protective device 540 has a protruding part 546 and extending part 544. The protruding part 546 covers the IC chip 180. The extending part 544 extends over the surface of substrate 502 to both control and adjust the variation in the character impedance of the transmission lines of the flip chip package structure 500. The extending part 544 further comprises a contact 542. A fixing material 522 is provided for respectively connecting the contacts 542 and contacts 520 so as to fasten the electrically protective device 540 to the substrate 502, and further electrically connect the electrically protective device 540 and a grounding layer in the laminated wiring of the substrate 520. The electrically protective device 540 is thus grounded. The top view of the electrically protective device 540 is equivalent to that of electrically protective device 440 shown in FIG. 4B, and is therefore omitted.

Further, the fixing material 522 may further provide connection of the IC chip 180 and protruding part 546 when heat dissipation is desired. Thus, the electrically protective device 540 is able to further assist IC chip 180 in heat dissipation.

The electrically protective device 540 is preferably electrically conductive material such as Al or Cu. The electrically protective device 540 may further comprise a coating layer on the surface thereof for anti-corrosion or enhancing the mechanical properties of the electrically protective device 540. The fixing material 542 is preferably electrically conductive material grounding the electrically protective device 540, and more preferably both electrically and thermally conductive material such as a mixture of silver powders and epoxy resins for both grounding the electrically protective device 540 and assisting IC chip 180 in heat dissipation.

There is a trace line area (not shown) beyond the contacts 510 on the surface of the substrate 502, conformally covered by the extending part 544, or with a gap therebetween not more than 40 mil. There is no gap between the trace line area and extending part 544 in this embodiment.

Further, the substrate 502 has a plurality of external contacts 530 respectively joined by a solder ball 532 on the other surface. The solder ball 532 may be Sn-based alloy with or without Pb. The flip chip package structure 500 may be attached to an external device (not shown) by reflowing the solder ball 532 to finish a final electronic product (not shown).

The relationships between positions of the laminated wiring of the substrate 502 and the extending part 544 are almost equivalent to those between the laminated wiring of the substrate 402 and the extending part 444 shown in FIG. 4C, and as such, illustration thereof is omitted.

There is no gap between the extending part 544 of the electrically protective device 540 in this embodiment and the substrate 502. The electrically protective device 540 in this embodiment is grounded by its electrical connection to a grounding layer in the laminated wiring of the substrate 502 (equivalent to the second-layer sub-wiring 452 and third-layer sub-wiring 453 shown in FIG. 4C). The range of the character impedance of the transmission lines of the flip chip package structure 500 in this embodiment, determined by electrically simulated experiment, is listed in Table 1, as are the mutual inductance values between two selected single trace lines.

Third Embodiment

Figure 6:
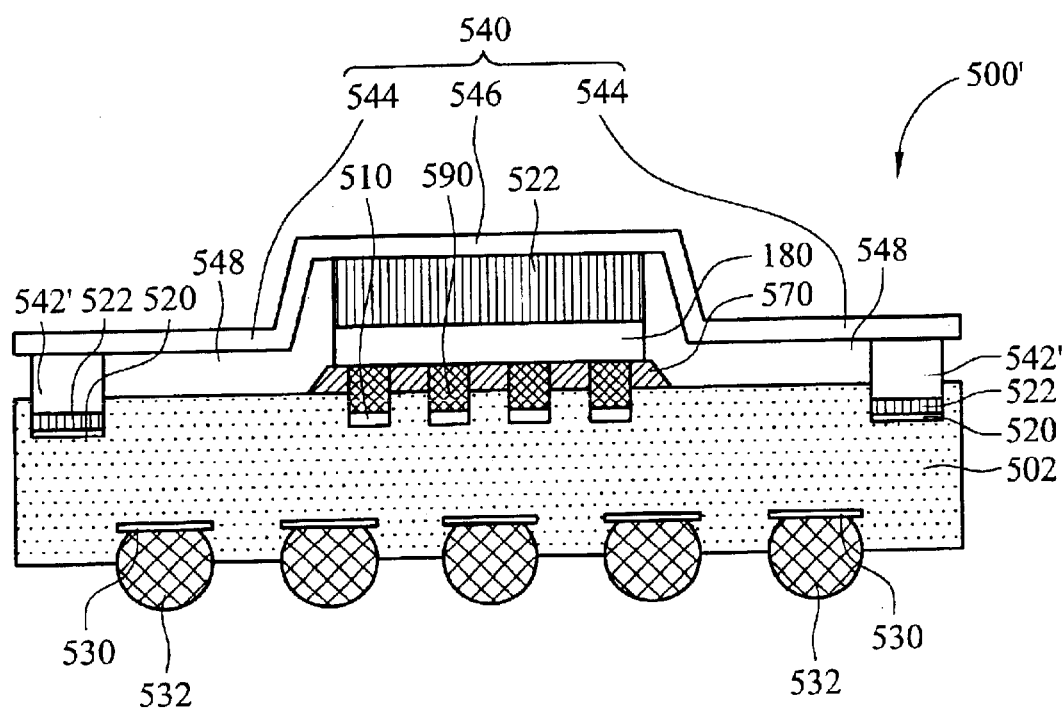
FIG. 6 is a cross-section illustrating a flip chip package structure in accordance with the third embodiment of the present invention.

Referring to FIG. 6, the flip chip package structure 500' in this embodiment, a modification of the flip chip package structure 500 in the second embodiment, is shown Comparing the two, a contact 542' is provided in this embodiment, rather than the contact 542 of the second embodiment. The height of contact 542' is adjustable, resulting in an air gap 548 not exceeding approximately 40 mil between the extending part 544 of the electrically protective device 540 and a trace line area (not shown) on a surface of the substrate 502 when the electrically protective device 540 is grounded by its electrical connection to a grounding layer in the laminated wiring of the substrate 502 (equivalent to the second-layer sub-wiring 452 and third-layer sub-wiring 453 shown in FIG. 4C). Other elements of the flip chip package structure 500' in this embodiment are disclosed in corresponding descriptions in the second embodiment, and are thus omitted.

There is an air gap 548 between the extending part 544 of the electrically protective device 540 and a trace line area (not shown) on a surface of the substrate 502. The range of the character impedance of the transmission lines of the flip chip package structure 500' in accordance with this embodiment of the present invention, determined by electrically simulated experiment, is listed in Table 1, as are the mutual inductance values between two selected single trace lines.

Comparative Example

Figure 7A:
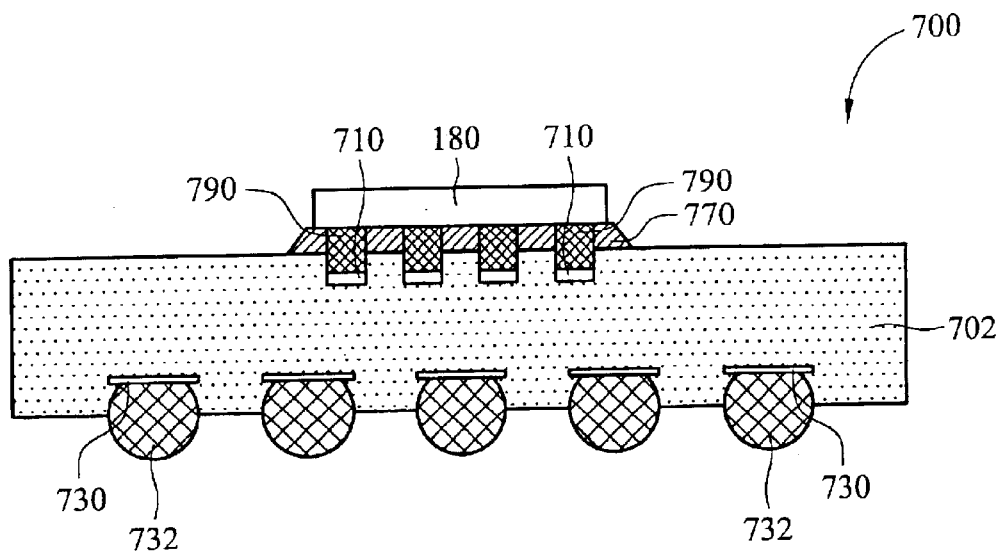
FIGS. 7A and 7B are a cross-section and a sketch map illustrating a conventional flip chip package structure as a comparative example.

Referring to FIG. 7A, a flip chip package structure 700 in accordance with the comparative example, a conventional flip chip package structure without electrical protection, is shown. A substrate 402 used therein is for BGA and comprises laminated interior wiring with six layers of sub-wirings.

The flip chip package structure 700 in accordance with the comparative example has a substrate 702 having a plurality of contacts 710, arranged at a predetermined pitch among each other, and a plurality of contacts 720 on a surface, an IC chip 160 overlying a surface of substrate 702 and electrically connected to the substrate 702 with a plurality of conductive bumps 790 arranged at the predetermined pitch among each other between the IC chip 180 and contacts 710, and an encapsulant 770 between the substrate 702 and IC chip 180, and specifically among the conductive bumps 790. There is a trace line area (shown in FIG. 7B as the top trace lines TT1 through TT5) beyond the contacts 710 on the surface of the substrate 702.

Further, the substrate 702 has a plurality of external contacts 730 respectively joined by a solder ball 732 on the other surface. The solder ball 732 may be Sn-based alloy with or without Pb. The flip chip package structure 700 may be attached to an external device (not shown) by reflowing the solder ball 732 to finish a final electronic product (not shown).

Figure 7B:
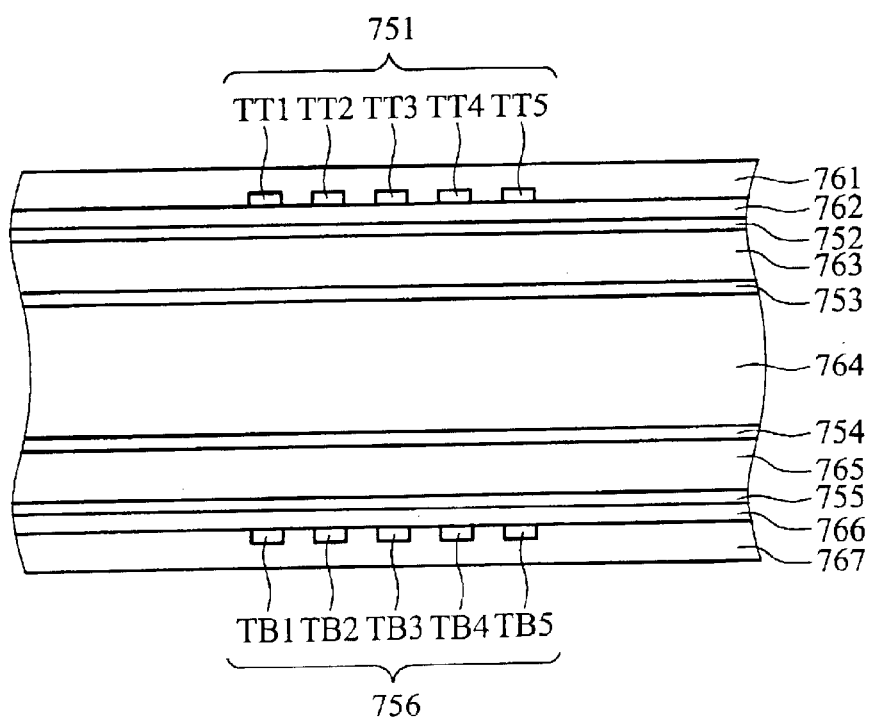

Referring to FIG. 7B, relationships between positions of the laminated wiring of the substrate 702 are shown. In FIG. 7B, more detailedly, five top trace lines TT1 through TT5 of a first-layer sub-wiring 751 and five bottom trace lines TE1 through TB5 of a sixth-layer sub-wiring 756 are shown. Line widths of top trace lines TT1 through TT5 and bottom trace lines TE1 through TB5 are all approximately 40 $\mu$m. Line thicknesses of top trace lines TT1 through TT5 and bottom trace lines TB1 through TB5 are all approximately 15 $\mu$m. The spaces between two neighboring top trace lines and between two neighboring bottom trace lines are all approximately 40 $\mu$m. The top trace lines TT1 through TT5 are covered by a solder mask 761 about 40 $\mu$m thick. The bottom trace lines TB1 through TB5 are covered by a solder mask 767 about 40 $\mu$m thick. There are a dielectric layer 762 about 33 $\mu$m thick between the first-layer sub-wiring 751 and second-layer sub-wiring 752, a dielectric layer 763 about 70 $\mu$m thick between the second-layer sub-wiring 752 and third-layer sub-wiring 753, a dielectric layer 764 about 502 $\mu$m thick between the third-layer sub-wiring 753 and fourth-layer sub-wiring 754, a dielectric layer 765 about 70 $\mu$m thick between the fourth-layer sub-wiring 754 and fifth-layer sub-wiring 755, and a dielectric layer 766 about 33 $\mu$m thick between the fifth-layer sub-wiring 755 and sixth-layer sub-wiring 756. The second-layer sub-wiring 752, third-layer sub-wiring 753, fourth-layer sub-wiring 754, and fifth-layer sub-wiring 755 are all massive copper layers respectively about 21 $\mu$m, 18 $\mu$m, 18 $\mu$m, and 21 $\mu$m thick. The second-layer sub-wiring 752 and third-layer sub-wiring 753 are both VSS layers acting as ground layers. The fourth-layer sub-wiring 754 and fifth-layer sub-wiring 755 are both VDD layers acting as power layers.

The range of the character impedance of the transmission lines of the flip chip package structure 700 in this embodiment, determined by electrically simulated experiment, is listed in Table 1, as are the mutual inductance values between two selected single trace lines.

TABLE 1

|  | mutual inductance between trace line TT1 and TT2 (nH/mm) | mutual inductance between trace line TT1 and TT3 (nH/mm) | mutual inductance between trace line TT1 and TT4 (nH/mm) | control of character impedance (Ω) |
|---|---|---|---|---|
| comparative example | 0.0710 | 0.0236 | 0.0104 | 51 |
| first embodiment | 0.0269 | 0.0146 | 0.0138 | 32~51 |
| second embodiment | 0.0131 | 0.00087 | 0.00006 | 30~51 |
| third embodiment | 0.0599 | 0.0149 | 0.00404 | 47~51 |

Referring to table 1, controllable ranges of character impedances of the comparative example and every embodiment, and mutual inductance between trace line TT1 and TT2, between trace line TT1 and TT3, and between trace line TT1 and TT4 respectively from the comparative example and every embodiment, as determined by the electrically simulated experiment, are shown. The controllable range of the character impedance of the conventional flip chip package structure 700 without electrical protection is only approximately 51 Ω. The controllable range of the character impedance of the flip chip package 400 in this embodiment with an ungrounded electrically protective device 440 without any gap between the extending part 444 and substrate 402 is about 32 Ω to 51 Ω. The controllable range of the character impedance of the flip chip package 500 in this embodiment with a grounded electrically protective device 540 without any gap between the extending part 544 and substrate 502 is about 30 Ω to 51 Ω. The controllable range of the character impedance of the flip chip package 500' in accordance with the third embodiment of the presents invention with a grounded electrically protective device 540 with an air gap not exceeding approximately 40 mil between the extending part 540 and substrate 502 is about 47 Ω to 51Ω.

As described, the flip chip package structure according to the present invention having an electrically protective device provides not only both control and adjustability of the variation in character impedance of transmission lines of the flip chip package structure, but also protects the IC chip from mechanical damage during subsequent processes, thereby completely achieving the desired objects.

According to mutual inductance between trace line TT1 and TT2, between trace line TT1 and TT3, and between trace line TT1 and TT4 respectively from the comparative example and disclosed embodiments as determined by the electrically simulated experiment, the flip chip package structures in the three embodiments all provide the added advantage of suppression of mutual inductance among .the trace lines.

Although the present invention has been particularly shown and described above with reference to two specific embodiments, it is anticipated that alterations and modifications thereof will no doubt become apparent to those skilled in the art. It is therefore intended that the following claims be interpreted as covering all such alteration and modifications as fall within the true spirit and scope of the present invention.

What is claimed is:

1. A flip chip package structure, comprising:
   a substrate having an interior wiring, a plurality of first contacts arranged at a predetermined pitch among each other on a surface, and a trace line area on the surface, beyond the first contacts;
   an IC chip overlying the surface of the substrate, the IC chip electrically connected to the substrate with a plurality of conductive bumps arranged at the predetermined pitch among each other between the IC chip and first contacts;
   an encapsulant between the substrate and IC chip, the encapsulant further filling the pitches among the conductive bumps; and
   an electrically protective device having a protruding part and extending part, the protruding part covering the IC chip, the extending part extending over the surface of the substrate with a gap between the extending part and the surface of the substrate not exceeding approximately 40 mil, the extending part further covering the trace line area and connected to the surface of the substrate with a fixing material so as to fasten the electrically protective device to the substrate.

2. The structure as claimed in claim 1, wherein the protruding part further connects to the IC chip by the fixing material.

3. The structure as claimed in claim 1, wherein the electrically protective device is Al or Cu.

4. The structure as claimed in claim 1, wherein the substrate further comprises a plurality of second contacts on the surface and the extending part further comprises a plurality of third contacts respectively connected to the second contacts so as to fasten the electrically protective device to the substrate.

5. The structure as claimed in claim 4, wherein the substrate further comprises a grounding device.

6. The structure as claimed in claim 5, wherein the second contacts further electrically connect to the grounding device using the interior wiring.

7. The structure as claimed in claim 1, wherein the fixing material is electrically conductive material.

8. The structure as claimed in claim 2, wherein the fixing material is both electrically and thermally conductive material.

9. The structure as claimed in claim 1, wherein the fixing material is a mixture of silver powders and epoxy resins.

10. The structure as claimed in claim 1, further comprising the extending part conformally extending over the surface of the substrate.

* * * * *

(12) INTER PARTES REEXAMINATION CERTIFICATE (976th)
United States Patent
Lin et al.

(10) Number: US 6,747,350 C1
(45) Certificate Issued: Oct. 24, 2014

(54) FLIP CHIP PACKAGE STRUCTURE

(75) Inventors: Wei-Feng Lin, Hsinchu (TW); Yin-Chieh Hsueh, Kaohsiung (TW); Chung-Ju Wu, Kaohsiung (TW)

(73) Assignee: Taichi Holdings, LLC, Wilmington, DE (US)

Reexamination Request:
No. 95/001,551, Feb. 18, 2011

Reexamination Certificate for:
Patent No.: 6,747,350
Issued: Jun. 8, 2004
Appl. No.: 10/455,525
Filed: Jun. 6, 2003

(51) Int. Cl.
*H01L 21/56* (2006.01)
*H01L 23/31* (2006.01)
*H01L 23/498* (2006.01)
*H01L 23/552* (2006.01)
*H01L 21/02* (2006.01)
*H01L 23/48* (2006.01)
*H01L 23/28* (2006.01)

(52) U.S. Cl.
USPC ............ 257/704; 257/707; 257/E23.062; 257/E23.114; 257/E21.503

(58) Field of Classification Search
None
See application file for complete search history.

(56) References Cited

To view the complete listing of prior art documents cited during the proceeding for Reexamination Control Number 95/001,551, please refer to the USPTO's public Patent Application Information Retrieval (PAIR) system under the Display References tab.

*Primary Examiner* — Erik Kielin

(57) ABSTRACT

A flip chip package structure. The structure includes a substrate, an IC chip electrically connected to the substrate through a plurality of conductive bumps, encapsulant between the substrate and IC chip, and an electrically protective device. The substrate has interior wiring, a plurality of first contacts arranged at a predetermined pitch among each other on a surface, and a trace line area beyond the first contacts on the surface. The electrically protective device has a protruding part covering the IC chip, and an extending part extending over the surface of the substrate with a gap as large as 40 mil. The extending part further covers the trace line area, and connects to the surface of the substrate using a fixing material.

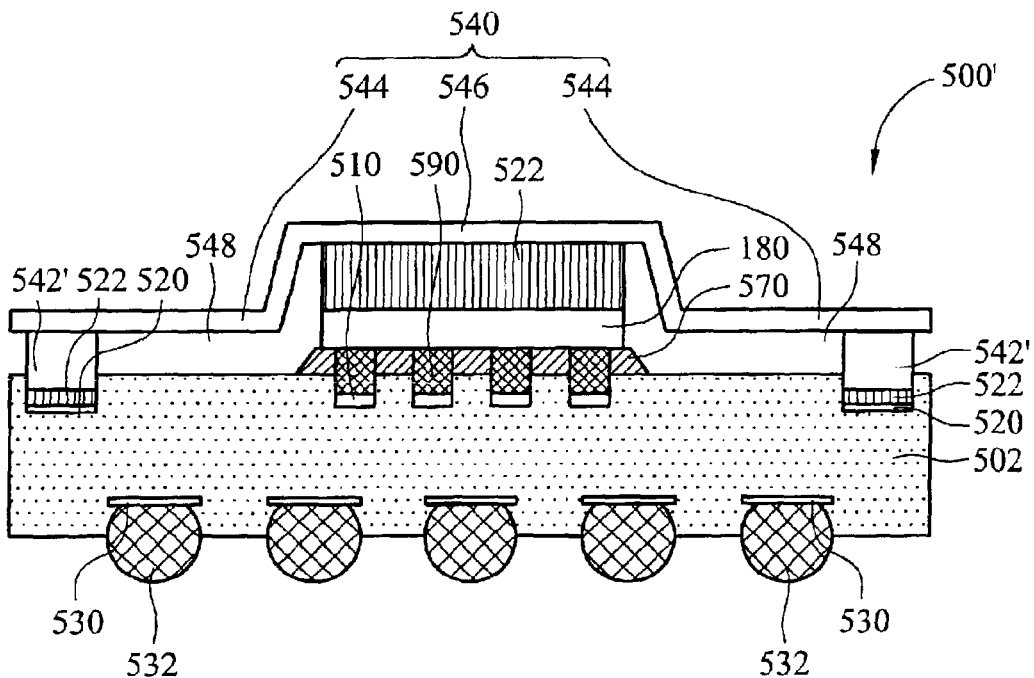

US 6,747,350 C1

INTER PARTES REEXAMINATION CERTIFICATE ISSUED UNDER 35 U.S.C. 316

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1-10 is confirmed.

New claims 11-54 are added and determined to be patentable.

11. *The structure as claimed in claim 1, wherein the gap includes an air gap.*

12. *The structure as claimed in claim 1, wherein the gap is formed at least between the extending part of the electrically protective device and the trace line area on the surface of the substrate.*

13. *The structure as claimed in claim 1, wherein the gap includes an air gap formed between the extending part of the electrically protective device and the trace line area on the surface of the substrate.*

14. *The structure as claimed in claim 1, wherein trace lines in the trace line area on the surface of the substrate include signal transmission lines.*

15. *The structure as claimed in claim 14, wherein the extending part covers the trace line area on the surface of the substrate with the gap therebetween sufficient to control a transmission characteristic of the trace lines in the trace line area.*

16. *The structure as claimed in claim 15, wherein the transmission characteristic includes a mutual inductance characteristic between trace lines in the trace line area.*

17. *The structure as claimed in claim 15, wherein the transmission characteristic includes crosstalk among trace lines in the trace line area.*

18. *A flip chip package structure comprising:*
*a substrate having an internal wiring, a plurality of first contacts arranged at a predetermined pitch among each other on a surface, and a trace line area on the surface, beyond the first contacts;*
*an IC chip overlying the surface of the substrate, the IC chip electrically connected to the substrate with a plurality of conductive bumps arranged at the predetermined pitch among each other between the IC chip and, the first contacts;*
*an encapsulant between the substrate and IC chip, the encapsulant further filling the pitches among the conductive bumps; and*
*an electrically protective device having a protruding part and extending part, the protruding part covering the IC chip, the extending part extending over the surface of the substrate with a gap between the extending part and the surface of the substrate not exceeding approximately 40 mil, the extending part further covering the trace line area and connected to the surface of the substrate with a fixing material so as to fasten the electrically protective device to the substrate, wherein the is sufficient to control an electrical transmission characteristic of trace lines in the trace line area on the surface of the substrate.*

19. *The flip chip package structure of claim 18, wherein the substrate further comprises a plurality of second contacts on the surface, beyond the trace line area, and the extending part further comprises a plurality of third contacts respectively connected to the second contacts so as to fasten the electrically protective device to the substrate.*

20. *The flip chip package structure of claim 18, further comprising the extending part conformally extending over the surface of the substrate.*

21. *The structure of claim 19, wherein the substrate further comprises a grounding device, and wherein the second contacts further electrically connect to the grounding device of the substrate using the interior wiring.*

22. *The structure of claim 18, wherein the electrical transmission characteristic includes mutual inductance and crosstalk between trace lines in the trace line area on the surface of the substrate.*

23. *A flip chip package structure, comprising:*
*a substrate having an interior wiring, a plurality of first contacts arranged at a predetermined pitch among each other on a surface, and a trace line area on the surface, beyond the first contacts;*
*an IC chip overlying the surface of the substrate, the IC chip electrically connected to the substrate with a plurality of conductive bumps arranged at the predetermined pitch among each other between the IC chip contacts;*
*an encapsulant between the substrate and IC chip, the encapsulant further filling the pitches among the conductive bumps; and*
*an electrically protective device having a protruding part and extending part, the protruding part covering the IC chip the extending part extending over the surface of the substrate with an air gap between the extending part and the surface of the substrate, the air gap not exceeding approximately 40 mil, the extending part further covering the trace line area and connected to the surface of the substrate with a fixing material so as to fasten the electrically protective device to the substrate.*

24. *The flip chip package structure of claim 23, wherein the substrate further comprises a plurality of second contacts on the surface, and the extending part further comprises a plurality of third contacts respectively connected to the second contacts so as to fasten the electrically protective device to the substrate.*

25. *The flip chip package structure of claim 24, wherein the substrate further comprises a grounding device.*

26. *The flip chip package structure of claim 25, wherein the second contacts further electrically connect to the grounding device using the interior wiring.*

27. *A flip chip package structure, comprising:*
*a substrate having an interior wiring, a plurality of first contacts arranged at a predetermined pitch among each other on a surface, a trace line area on the surface, beyond the first contacts, and a plurality of second contacts on the surface, beyond at least a portion of the trace line area;*
*an IC chip overlying the surface of the substrate, the IC chip electrically connected to the substrate with a plurality of conductive bumps arranged at the predetermined pitch among each other between the IC chip and first contacts;*
*an encapsulant between the substrate and IC chip, the encapsulant further filling the pitches among the conductive bumps; and*
*an electrically protective device having a protruding part and extending part, the protruding part covering the IC* chip, the extending part extending over the surface of the substrate with an air gap between the extending part and the surface of the substrate, the air gap not exceeding approximately 40 mil, the extending part further covering the trace line area and comprising a plurality of third contacts respectively connected to the second contacts so as to fasten the electrically protective device to the substrate with an electrically conductive fixing material so as to fasten the electrically protective device to the substrate.

28. The flip chip package structure of claim 27, wherein the substrate further comprises a grounding device.

29. The flip chip package structure of claim 28, wherein the second contacts further electrically connect to the grounding device using the interior wiring.

30. The structure as claimed in claim 18, wherein the gap includes an air gap.

31. The structure as claimed in claim 18, wherein the gap is formed at least between the extending part of the electrically protective device and the trace line area on the surface of the substrate.

32. The structure as claimed in claim 18, wherein the gap includes an air gap formed between the extending part of the electrically protective device and the trace line area on the surface of the substrate.

33. The structure as claimed in claim 18, wherein trace lines in the trace line area on the surface of the substrate include signal transmission lines.

34. The structure as claimed in claim 18, wherein the transmission characteristic includes crosstalk among trace lines in the trace line area.

35. The structure as claimed in claim 18, wherein the transmission characteristic includes mutual inductance among trace lines in the trace line area.

36. The structure as claimed in claim 18, wherein the protruding part further connects to the IC chip by the fixing material.

37. The structure as claimed in claim 18, wherein the electrically protective device is Al or Cu.

38. The structure as claimed in claim 18, wherein the substrate further comprises
   a plurality of second contacts on the surface and
   the extending part further comprises a plurality of third contacts respectively connected to the second contacts so as to fasten the electrically protective device to the substrate.

39. The structure as claimed in claim 38, wherein the substrate further comprises a grounding device.

40. The structure as claimed in claim 18, wherein the fixing material is electrically conductive material.

41. The structure as claimed in claim 36, wherein the fixing material is both electrically and thermally conductive material.

42. The structure as claimed in claim 23, further comprising the extending part conformally extending over the surface of the substrate.

43. The structure as claimed in claim 23, wherein the gap is formed at least between the extending part of the electrically protective device and the trace line area on the surface of the substrate.

44. The structure as claimed in claim 23, wherein trace lines in the trace line area on the surface of the substrate include signal transmission lines.

45. The structure as claimed in claim 23, wherein the extending part covers the trace line area on the surface of the substrate with the gap therebetween sufficient to control a transmission characteristic of the trace lines in the trace line area.

46. The structure as claimed in claim 45, wherein the transmission characteristic includes crosstalk among trace lines in the trace line area.

47. The structure as claimed in claim 45, wherein the transmission characteristic includes mutual inductance among trace lines in the trace line area.

48. The structure of claim 45, wherein the electrical transmission characteristic includes mutual inductance and crosstalk between trace lines in the trace line area on the surface of the substrate.

49. The structure as claimed in claim 23, wherein the protruding part further connects to the IC chip by the fixing material.

50. The structure as claimed in claim 23, wherein the electrically protective device is Al or Cu.

51. The structure as claimed in claim 23, wherein the substrate further comprises
   a plurality of second contacts on the surface and
   the extending part further comprises a plurality of third contacts respectively connected to the second contacts so as to fasten the electrically protective device to the substrate.

52. The structure as claimed in claim 51, wherein the substrate further comprises a grounding device.

53. The structure as claimed in claim 23, wherein the fixing material is electrically conductive material.

54. The structure as claimed in claim 49, wherein the fixing material is both electrically and thermally conductive material.

* * * * *